United States Patent
Ikram et al.

(10) Patent No.: US 9,355,206 B2
(45) Date of Patent: May 31, 2016

(54) SYSTEM AND METHOD FOR AUTOMATED FUNCTIONAL COVERAGE GENERATION AND MANAGEMENT FOR IC DESIGN PROTOCOLS

(71) Applicant: Cavium, Inc., San Jose, CA (US)

(72) Inventors: Shahid Ikram, Shrewsbury, MA (US); Isam Akkawi, Santa Clara, CA (US); John Perveiler, Oxford, MA (US); David Asher, Sutton, MA (US); James Ellis, Hubbardston, MA (US)

(73) Assignee: CAVIUM, INC., San Jose, CA (US)

( * ) Notice: Subject to any disclaimer, the term of this patent is extended or adjusted under 35 U.S.C. 154(b) by 58 days.

(21) Appl. No.: 14/288,121

(22) Filed: May 27, 2014

(65) Prior Publication Data

US 2015/0302133 A1 Oct. 22, 2015

Related U.S. Application Data

(60) Provisional application No. 61/982,695, filed on Apr. 22, 2014.

(51) Int. Cl.
| | |
|---|---|
| *G06F 17/50* | (2006.01) |
| *G06F 11/273* | (2006.01) |
| *G06F 15/78* | (2006.01) |
| *G06F 11/267* | (2006.01) |

(52) U.S. Cl.
CPC ........ *G06F 17/5081* (2013.01); *G06F 17/5045* (2013.01); *G06F 11/267* (2013.01); *G06F 11/2733* (2013.01); *G06F 15/78* (2013.01)

(58) Field of Classification Search
None
See application file for complete search history.

(56) References Cited

U.S. PATENT DOCUMENTS

| | | | | |
|---|---|---|---|---|
| 6,975,976 B1 * | 12/2005 | Casavant | ........ | G01R 31/318314 703/14 |
| 2005/0283664 A1 * | 12/2005 | Coulter | ................. | G06F 11/261 714/15 |

OTHER PUBLICATIONS

Spear, C. and Tumbush, G., System Verilog for Verification, Third Edition, Springer, ISBN 978-1-4614-0714-0, 608 pages, 2012.
Tasiran, S. Yu, Yuan and Batson, Brannon, Using a Formal Specification and a Model Checker to Monitor and Direct Simulation, In Proceedings of DAC2003, Jun. 2-6, 2003, pp. 356-361.
(Continued)

*Primary Examiner* — A. M. Thompson
(74) *Attorney, Agent, or Firm* — Duane Morris LLP; David T. Xue

(57) ABSTRACT

A new approach is proposed that contemplates a system and method to support automated functional coverage generation and management for an IC design protocol. The proposed approach takes advantage of table-based high-level (e.g., transaction-level) specifications of the IC design protocol, wherein the state tables are readable and easily manageable (e.g., in ASCII format) in order to automatically generate functional coverage for the IC design protocol, which include but are not limited to, coverage points, protocol transitions, and/or transaction coverage. The automatically generated functional coverage is then verified via formal verification and simulated at the register-transfer level (RTL) during the coverage generation and management process. The coverage data from the formal verification and the simulation runs are then analyzed and used to guide and revise the IC design protocol in a coverage-based closed-loop IC design process.

19 Claims, 6 Drawing Sheets

(56) References Cited

OTHER PUBLICATIONS

Su, Man-Yun, etc., FSM-based Transaction-level Functional Coverage for Interface Compliance Verification, In Proceedings of Asian and South Pacific Conference on Design Automation, Jan. 24-27, 2006.
Lachish, O., etc., Hole Analysis for Functional Coverage Data, In Proceedings of DAC2002, Jun. 2-6, 2003.
Kwon, Young-Su, etc., Systematic Functional Coverage Metric Synthesis from Hierarchical Temporal Event Relation Graph, In Proceedings of DAC2004, Jun. 2-6, 2003.
Verma, Shireesh, Harris, Ian etc., Automatic Generation of Functional Coverage Models from Behavioral Verilog Descriptions, In Proceedings of DATE2007, Apr. 16-20, 2007.
Weber, Ross, Modeling and Verifying Cache-Coherent Protocols, VIP, and Designs, Jasper Design Automation, Jun. 2011.
Sorin, D.J., etc., Specifying and Verifying a Broadcast and a Multicast Snooping Cache Coherence Protocol, Reasoning about naming Systems, Transactions on Parallel and Distributed Systems (TPDS) vol. 13, No. 6, Jun. 2002, pp. 556-578.
Ho, Pei, etc., Smart Simulation using Collaborative Formal and Simulation Engines, In IEEE International Conference on CAD, pp. 120-126, 2000.
Holzmann, G.J., The Spin Model Checker: Primer and Reference Manual, Addison-Wesley, ISBN 0-321-22862-6, 608 pages, 2004.
IEEE Standard for System Verilog—Unified Hardware Design, Specification and Verification Language, IEEE 1800-2012, 2012.
Vijayaraghavan, S., etc., A Practical Guide for system Verilog Assertions, Springer, ISBN 0-387-26049-8, 334 pages, 2005.
Bergeron, Janick, Writing Testbenches using System Verilog, First Edition, Springer, ISBN 978-1-4419-39784-0, 406 pages, 2006.
Sedgewick , Robert and Wayne, Kevin, Algorithm, Fourth Edition, Springer, ISBN 978-0-3215-7351-3, 992 pages, 2011.
Plakal et al., Lamport Clocks: Verifying A Directory Cache-Coherence Protocol, Proceedings of the Tenth Annual ACM Symposium of Parallel Algorithms and Architectures, Jun. 28-Jul. 2, 1998, pp. 67-76.
Eisner et al., A Methodology for Formal Design of Hardware Control with Application to Cache Coherence Protocols, Proceedings of the 37th Annual Design Automation Conference, Jun. 2000, 6 pages.

\* cited by examiner

| Current State | | | | | Next State | | | | | Outputs | | | Inputs |
|---|---|---|---|---|---|---|---|---|---|---|---|---|---|
| Cmd | H | N1 | N2 | N3 | Cmd | H | N1 | N2 | N3 | N1 | N2 | N3 | Req/Resp/Frwd |
| none | E | I | I | I | none | S | S | I | I | RD_RSP (Read Response) | - | - | OCI_RD (Read from remote node) |
| none | S | S | I | I | LCL_WR | S | S->I | I | I | INV (Invalidate) | - | - | LCL_WR_LCL_A (local write to home address) |
| LC_WR | S | S->I | I | I | none | M | I | I | I | - | - | - | INV_RSP (Invalidate response) |

FIG. 4A

| Current State | | Next State | | Outputs | | | Inputs |
|---|---|---|---|---|---|---|---|
| Cmd | St | Cmd | St | H | N2 | N3 | Req/Resp/Frwd |
| none | I | OCI_RD | I | OCI_RD (Read from remote node – i.e. home) | - | - | LCL_RD_RMT_A (local read – remote address) |
| OCI_RD | I | none | S | - | - | - | RD_RSP (read response) |
| none | S | none | I | INV_RSP (Invalidate Response) | - | - | INV (Invalidate) |

FIG. 4B

| Current State | | | Next State | | | Outputs | Inputs |
|---|---|---|---|---|---|---|---|
| Cmd | H | N1 | Cmd | H | N1 | N1 | Req/Resp/Frwd |
| none | I | E | E2S | S | S | FWDH | OCI_LD |
| E2S | S | S | E2S | S | S->I | none | REM_INV |
| E2S | S | S->I | none | M | I | - | VDATA |

```
sequence homeTrans_111(logic [A-1:0][3:0]Cmd, logic[A-1:0] [1:0]H_state,
logic[A-1:0] [1:0]N1_state,logic [A-1:0][4:0] output,logic [A-1:0][4:0] Inputs);
 (((Cmd ==  NONE)&&(H_state == I)&&(N1_state == E) && (Outputs == NONE )&& (Inputs == NONE ))[*1:$]) //Initial waiting state
##1 ((Cmd == E2S)&&(H_state == S)&&(N1_state == S) && (Outputs == FWDH)&& (Inputs == NONE ))//Transition sate.
##1 (((Cmd ==  E2S)&&(H_state == S)&&(N1_state == S) && (Outputs == NONE)&& (Inputs == NONE ))[*1:$]) //Waiting state
##1 ((Cmd ==  E2S)&&(H_state == S)&&(N1_state == S) && (Outputs == NONE)&& (Inputs == REM_INV )) //Transition state
##1 (((Cmd ==  E2S)&&(H_state == S)&&(N1_state == S_I) && (Outputs == NONE)&& (Inputs == NONE ))[*1:$]) //Waiting state
##1 ((Cmd ==  E2S)&&(H_state == S)&&(N1_state == S_I) && (Outputs == NONE)&& (Inputs == VDATA )) //Transition state
##1 ((Cmd ==  E2S)&&(H_state == S)&&(N1_state == I) && (Outputs == NONE)&& (Inputs == NONE )); //End state
endsequence
//An instance of transaction coverage for OCI_LD request from a core.
cover_homeTrans_OCI_LD_1:cover property((Request == OCI_LD) ##1
homeTrans_111(cmd[addr],h_state[addr],n1_state[addr],output[addr],input[addr]));
```

```
covergroup Home_Monitor;
requests: coverpoint request_type {
bins cov_LD[] = {OCI_LD};
....//Other core requests and their bins.}
transitions: coverpoint {request_type,cmd,h_state,r_state,output,input }
    {//Auto generated transitions cover points.
    `include "HOME_TRANS_COV.sv"       }
  endgroup //Home_Monitor ....... A sample auto-generated coverpoint from HOME_TRANS_COV.sv.....

bins HomeTrans_OCI_LD_1 = ({OCI_LD,NONE,INV,EXL,NONE,NONE} =>
{OCI_LD,E2S,SHR,SHR,FWDE,NONE }=>{OCI_LD,E2S,SHR,SHR,NONE,NONE } ) [*1:SDELAY]=>
{OCI_LD,E2S,SHR,SHR,INVL,NONE }=>{OCI_LD,E2S,SHR,S_I,NONE,NONE } ) [*1:SDELAY]=>
{OCI_LD,E2S,SHR,S_I,VDATA,NONE }=>{NONE,NONE,SHR,INV,NONE,NONE } ) ;
```

FIG. 6

SYSTEM AND METHOD FOR AUTOMATED FUNCTIONAL COVERAGE GENERATION AND MANAGEMENT FOR IC DESIGN PROTOCOLS

CROSS-REFERENCE TO RELATED APPLICATIONS

This application claims the benefit of U.S. Provisional Patent Application No. 61/982,695, filed Apr. 22, 2014, and entitled "Table-based Functional Coverage Management for SOC Protocols," and is hereby incorporated herein in its entirety by reference.

This application is also related to co-pending U.S. patent application Ser. No. 14/151,748, filed Jan. 9, 2014, now U.S. Patent No. 9,058,463, and entitled "Systems and methods for specifying, modeling, implementing and verifying IC design protocols," and is hereby incorporated herein in its entirety by reference.

BACKGROUND

Random simulation-based verification is the main vehicle for integrated circuit (IC) design verification such as verification of System-on-Chip (SOC) and and/or an application-specific integrated circuit (ASIC) chip. The key indicators for the quality and completeness of this verification are coverage metrics, which can be categorized into two main classes: code coverage and functional coverage. Code coverage exploits the structure of register-transfer level (RTL) design to auto-generate coverage points of the IC design and hence make sure that all parts of the implementation of the IC design are exercised or visited by the random stimuli. Although some RTL simulator vendors provide built-in code coverage as well as state machine coverage generation tools, such auto-generated coverage information is not sufficient to show that all features of the IC design are exercised. Consequently, IC designers and verifiers almost always have to add functional coverage in their armor of coverage metrics.

Functional coverage captures the functionality of the IC design and provides an orthogonal view of random simulation quality by focusing on design features instead of the implementation of the IC design (as is the case of code coverage). Currently, the creation of functional coverage model(s) of the IC design is mostly a manual process, where verifiers study high-level English specification of the IC design and work with the IC designers to identify important design features. These design features are then translated into cover properties, cover points, and/or cross-coverage, etc., to create so-called coverage monitors, which can run in parallel with the IC design to monitor coverage of the key design features during simulation runs on the IC design. A coverage analysis process then processes the data generated by these coverage monitors to estimate coverage achieved through random simulation.

The manual identification of important design features and creation of the coverage monitors often suffers from various problems including but not limited to, outdated IC design specifications, errors in manual translation of the design features, and management of a monumental number of coverage points especially in the enormous protocol coverage space. For a non-limiting example, any industrial strength SOC protocol may have thousands of legally defined sequences, with many more illegal sequences, which leads to two undesirable strategies for coding functional coverage points: manually generating a coverage point for each of the thousands of legal transaction sequences, or crossing cover all state variables and manually excluding the enormous number of illegal sequences. Neither of these strategies works well for an evolving protocol and implementation and almost always leads to missing cases. Therefore, there is a need for an improved system and method to generate functional design coverage for IC design protocols.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A and 4B depict examples of home and remote tables provided by the IC design protocol, respectively.

FIG. 5A depicts an example of a table for a sample home transaction under OCI and FIG. 5B depicts an example of one possible SVA sequence capturing the OCI transaction shown in the table of FIG. 5A.

FIG. 6 depicts an example of an implementation of the coverage monitor for the home tables' protocol.

DETAILED DESCRIPTION OF EMBODIMENTS

Figure 1:
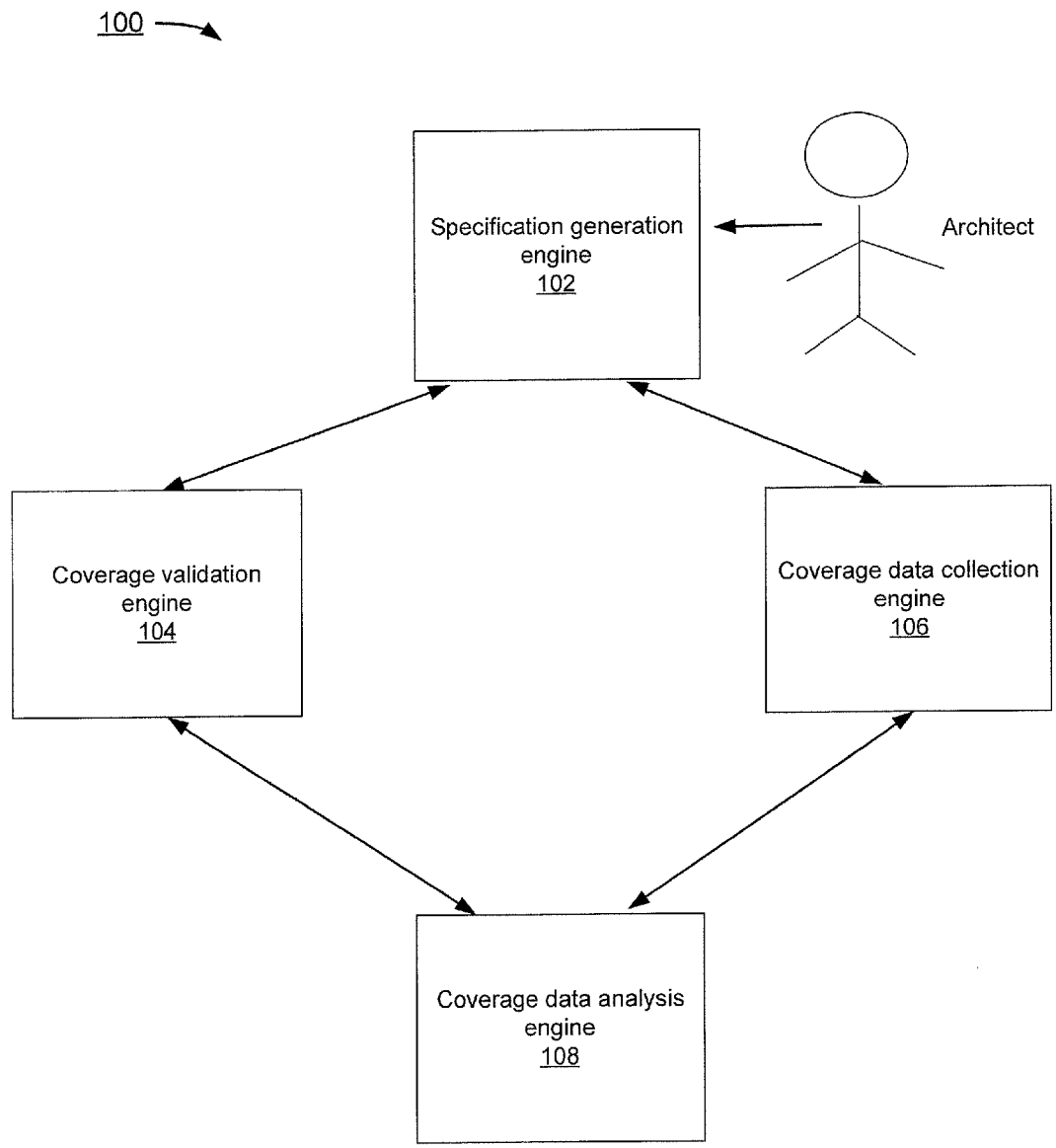
FIG. 1 shows an example of a system diagram to support automatic functional coverage generation and management for an IC design protocol.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A new approach is proposed that contemplates systems and methods to support automated functional coverage generation and management for an IC design protocol. The proposed approach takes advantage of table-based high-level (e.g., transaction-level) specifications of the IC design protocol, wherein the state tables are readable and easily manageable (e.g., in ASCII format) in order to automatically generate functional coverage for the IC design protocol, which include but are not limited to, coverage points, protocol transitions, and/or transaction coverage. The automatically generated functional coverage is then verified via formal verification and simulated at the register-transfer level (RTL) during the coverage generation and management process. The coverage data from the formal verification and the simulation runs are then analyzed and used to guide and revise the IC design protocol in a coverage-based closed-loop IC design process.

The proposed approach incorporates and validates IC design protocol changes in the IC design via the analysis, which then become part of regressions right away with little intervention, so that the IC designer and validator can focus on coverage holes and bugs in the IC design at the architectural-level as well as RTL instead of worrying about bringing the protocol changes at the architectural-level for verification. The proposed approach achieves fast design verification closure by quickly converging on only true failures/misses in the IC design and weeding out any false errors/failures/misses. Moreover, the proposed approach contributes to generating more interesting functional coverage cases such as event cross-coverage across both home and remote finite state machines (FSMs), transition coverage of all the legal transitions, and transaction coverage of all legal transactions as a sequence of legal transitions. By machine-generating coverage points and/or collaterals automatically, the proposed approach reduces human error, drastically decreases the time required to code, and is capable of rapidly incorporating changes into the IC design protocol, thus achieving tape-out in record time.

As referred to hereinafter, the IC design protocol (or protocol in short) describes details of an IC design at various levels. Specifically, the protocol describes various components in the IC design project, the relationships, connections, and interactions among these components, and the interfaces between these components and external components outside of the IC chip. In some embodiments, the protocol includes one or more state tables or models used for formal verification of the protocol at the architectural level and/or a synthesizable package used for implementation of the protocol at the micro-architectural (formal verification) level or RTL as discussed below.

FIG. 1 shows an example of a system diagram to support automatic functional coverage generation and management for an IC design protocol. Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be connected by one or more networks.

In the example of FIG. 1, the system 100 includes at least a specification generation engine 102, a coverage validation engine 104, a coverage data collection engine 106 and a coverage data analysis engine 108. As used herein, the term engine refers to software, firmware, hardware, or other component that is used to effectuate a purpose. The engine will typically include a computing unit/appliance/host and software instructions that are stored in a storage unit such as a non-volatile memory (also referred to as secondary memory) of the computing unit for practicing one or more processes. When the software instructions are executed, at least a subset of the software instructions is loaded into memory (also referred to as primary memory) by the computing unit, the computing unit becomes a special purpose for practicing the processes. The processes may also be at least partially embodied in the computing unit into which computer program code is loaded and/or executed, such that, the computing unit becomes a special purpose computing unit for practicing the processes. When implemented on a general-purpose computing unit, the computer program code segments configure the computing unit to create specific logic circuits. The processes may alternatively be at least partially embodied in a digital signal processor formed of application specific integrated circuits for performing the processes.

In the example of FIG. 1, each of the engines can run on one or more hosting devices (hosts). Here, a host can be a computing device, a communication device, a storage device, or any electronic device capable of running a software component. For non-limiting examples, a computing device can be but is not limited to a laptop PC, a desktop PC, a tablet PC, or a server machine. A storage device can be but is not limited to a hard disk drive, a flash memory drive, or any portable storage device. A communication device can be but is not limited to a mobile phone.

In the example of FIG. 1, the specification generation engine (or specification generator) 102 is configured to accept inputs from an architect of an IC design protocol and automatically generates one or more specifications for functional coverage of the IC design in ASCII-formatted state tables. These table-based specifications can be used for various purposes, including but not limited to, formal verification, RTL simulation, and coverage collaterals for coverage management. Although table-based specifications have been around for a long time and have been used in various phases of an IC design process, they are generally written for the purpose of being used with one signal objective/task in mind and they usually contain a lot of hidden state information, such as transitional states, which requires a leap of faith between the architect, the implementer and the verifier of the IC design team. In contrast, the table-based specifications generated by the specification generation engine 102 do not have any hidden states or assumptions, redundancy, or dead-ends, and they are readable and can be understood, consumed, and managed by all relevant parties at all phases in the IC design process.

In some embodiments, the specification generation engine 102 generates the state tables for the specifications by first collecting one or more of the following items:

All commands in the IC design protocol that can cause transition between states, wherein such commands can be but are not limited to, commands, responses, probes, etc.

A state table, which is initially populated with all "Idle" states.

A transition table that covers all valid transition "commands" and current "State" combination, and the resultant next "State."

The specification generation engine 102 then iterates over all the commands and the state table to produce the next/new "State" or sequence. If the new "State" is not in the state table yet, the specification generation engine 102 adds the "State" to the state table. In some embodiments, the specification generation engine 102 recursively applies the commands to all of the new "States" generated during the process. The resulting table should include a plurality of sequences of states, wherein a state in each of the sequences can be reached from a prior state in the same sequence via one or more commands. In some embodiments, when the entire state table is generated, the specification generation engine 102 generates and outputs the state table-based specifications in various formats. For a non-limiting example, the specifications can be in the form of a model used for formal verification of the protocol by the coverage validation engine 104 at the architectural level and/or in the form of a synthesizable package such as a System Verilog (SV) package that includes state transitions for simulation by the coverage data collection engine 106 at RTL as described below.

In the example of FIG. 1, the coverage validation engine 104 is configured to validate that all the states, transitions, and sequences in the state tables of the specifications generated by specification generation engine 102 are reachable, e.g., a state in each of the sequences in the state tables can be reached from a prior state in the same sequence via one or more transition commands. In some embodiments, the coverage validation engine 104 performs the validation process against a formal verification (FV) model that is also generated by the specification generation engine 102, wherein the FV model is a formally verifiable set of files, generated as a composition of one or more roles/services tables, templates, and instrumentations of the nodes (chips) in the IC design protocol.

In some embodiments, the coverage validation engine 104 is configured to further take coverage properties specified in System Verilog Assertions (SVA) specification automatically generated by the specification generation engine 102 as its input in addition to the FV model. Here, SVA is an IEEE standard and a language to describe properties of the IC design protocol in a declarative way with the ability to be used both in formal verification as well as simulation-based environment. As its output, the coverage validation engine 104 generates a reachable list of states for the IC design protocol, describing what subset of states in the table-based specifications for the functional coverage of the IC design is reachable at the architectural level. Any unreachable state in the specifications for the functional coverage has to be validated by the architect of the IC design protocol as it is either a potential bug in the IC design protocol or a miss by the specification generation engine 102 for failing to identify all sequences of states to generate a complete functional coverage for the IC design.

In the example of FIG. 1, the coverage data collection engine 106 is configured to conduct simulation of the IC design protocol at the RTL and to collect as its output a composition/list of reached coverage points, which are sampling points reached during the simulation. Here, the coverage points are automatically generated by the specification generation engine 102 for each of the thousands of legally defined and/or illegal sequences in the IC design protocol, wherein the coverage points are used to model one or more of state coverage, transitions coverage, transaction/sequence coverage and cross-coverage for the IC design protocol. In some embodiments, the coverage points are modeled and provided by the specification generation engine 102 via a reference model based on, e.g., System Verilog coverage groups. Since the RTL is the actual implementation of the IC design, these coverage points should be fully covered for the completeness and correctness of the IC design. These automatically-generated coverage points share the same benefits as the automatically-generated FV model in that they reduce human error, drastically decrease the time required to code, and can rapidly incorporate and propagate any changes to the protocol in all phases of the IC design process. Such automatic generation of coverage points eliminates the need for manual generation of coverage points as well as manual exclusion of the illegal sequences. Moreover, the automatically-generated coverage points contribute to generate more interesting functional coverage points, which include but are not limited to, event cross-coverage across home and remote nodes, transition coverage of all the legal transitions, and transaction coverage of all legal transactions as a sequence of transitions between the states.

In some embodiments, the coverage data collection engine 106 further takes the annotated SV package as its input, which is annotated with coverage properties automatically generated from the tables of the specifications by the specification generation engine 102 and is used to flush the RTL coverage data to text files during simulation. Here, the SV package includes state transitions for RTL implementation of the chip using the same underlying protocol representation in the reference specification for formal verification to further reduce chances of introduction of new errors during the RTL implementation. The SV package captures the behaviors, functions, and interactions among the gates and transistors within each high level components in the reference specification at the architectural level. The SV package is synthesizable in the sense that RTL implementation of the chip design can be directly synthesized by the coverage data collection engine 106 from the SV package (vs., for a non-limiting example, a class-based specification or model that has to be run as a computer program first).

In the example of FIG. 1, the coverage data analysis engine 108 is configured to analyze the coverage of the IC design protocol based on coverage data generated by the coverage validation engine 104 at the formal verification level and by the coverage data collection engine 106 at the RTL simulation, respectively. Such analysis contributes to the convergence of the verification process of the functional coverage of the IC design protocol. Specifically, the coverage data analysis engine 108 compares the coverage data collected at the formal verification level and the RTL simulation and acts accordingly under the following four scenarios:

- If a transaction is reachable at both the formal verification and the RTL simulation level, the coverage data analysis engine 108 confirms that the functional coverage generated by the specification generation engine is correct.
- If a transaction is reachable under the FV model at the formal verification level but unreachable at the RTL simulation level, it represents either a hole in the coverage points generated or a bug at the RTL implementation of the IC design protocol. Under such scenario, the coverage data analysis engine 108 is configured to generate a guidance for tracing the problem and providing the guidance to the coverage data collection engine 106 for revised simulation at the RTL.
- If a transaction is not reachable under the FV model at the formal verification level but reachable at the RTL simulation level, that represents either a bug in the FV model at the formal verification level or in the RTL implementation of the IC design protocol. Under such scenario, the coverage data analysis engine 108 is configured to generate and provide a guidance to the coverage validation engine 104 for revised FV model for formal verification.
- If a transaction is not reachable at both the formal verification level and the RTL simulation level, then it is a bug in the specification of the functional coverage of the IC design. Under such scenario, the coverage data analysis engine 108 is configured to provide feedback/guidance to the specification generation engine 102 to revise the specifications.

In some embodiments, as a precondition for the coverage analysis, the coverage data analysis engine 108 requires that all the coverage data collected at the formal verification level and the RTL to include some kind of back-annotation to show that the coverage data collected belongs to the same source (i.e., the functional coverage of the same IC design). This precondition is met under the approach described above, since both the coverage validation engine 104 and the coverage data collection engine 106 generate their coverage data based on the same specification of the functional coverage generated by the specification generation engine 102.

Figure 2:
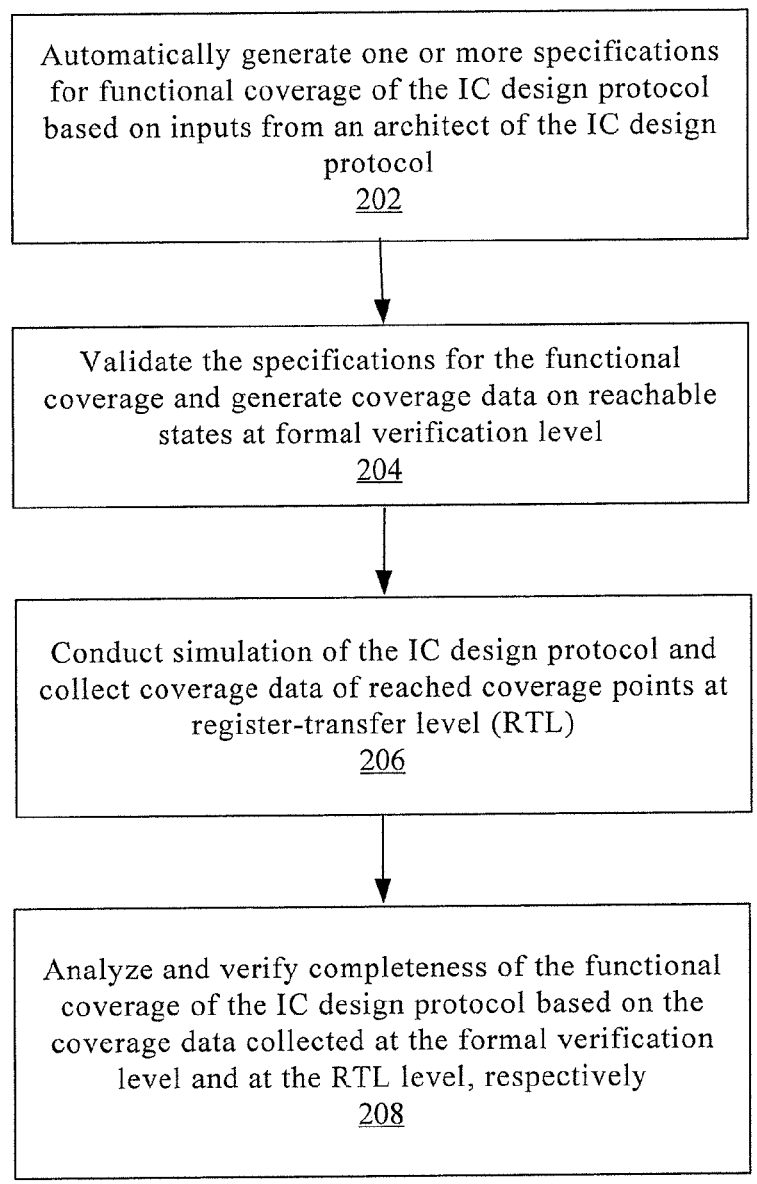
FIG. 2 depicts a flowchart of an example of a process to support automatic functional coverage generation and management for an IC design protocol.

FIG. 2 depicts a flowchart of an example of a process to support automatic functional coverage generation and management for an IC design protocol. Although this figure depicts functional steps in a particular order for purposes of illustration, the process is not limited to any particular order or arrangement of steps. One skilled in the relevant art will appreciate that the various steps portrayed in this figure could be omitted, rearranged, combined and/or adapted in various ways.

In the example of FIG. 2, the flowchart 200 starts at block 202, where one or more specifications for functional coverage of an integrated circuit (IC) design protocol are automatically generated based on inputs from an architect of the IC design protocol. The flowchart 200 continues to block 204, where the specifications for the functional coverage are validated and coverage data on reachable states is generated at formal verification level. The flowchart 200 continues to block 206, where simulation of the IC design protocol is conducted and coverage data of reached coverage points is collected at the RTL. The flowchart 200 ends at block 208 where completeness of the functional coverage of the IC design protocol is analyzed and verified based on the coverage data collected at the formal verification level and at the RTL, respectively.

Figure 3:
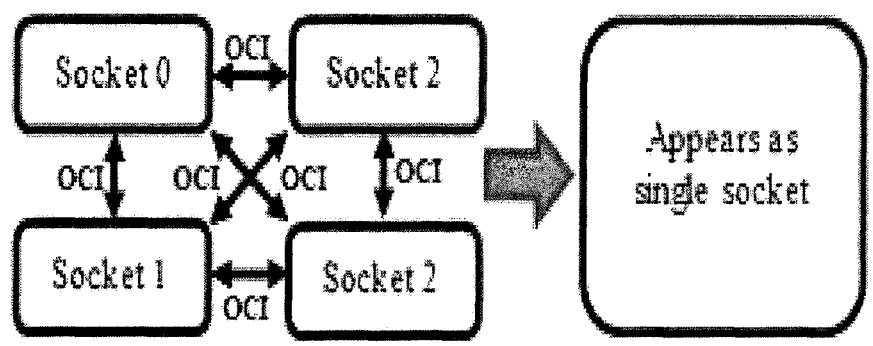
FIG. 3 depicts an example of four SOCs connected together as a single logical multicore processor via OCI connections.

The automatic functional coverage generation and management process described above can be applied to, for a non-limiting example, a multichip interconnects protocol such as OCTEON Coherent Interconnect (OCI), which is a variant of directory-based cache-coherence protocols. FIG. 3 depicts an example of two to four OCTEON III SOCs (Socket 0, . . . , Socket 3) connected together as a single logical multicore processor via OCI connections among them. Such OCI-based architecture achieves coherency across cores, Memory, networks, I/O, and coprocessors of the design and eliminates unnecessary memory copies in the design.

In some embodiments, each address of a top-level SOC under the cache coherence protocol is mapped to a unique socket as shown in FIG. 3, which represents the address's home node. Since the address space is shared among a plurality of nodes, each representing a chip (e.g., SOC), any of the nodes may request data or ownership from any datum in the address space. If the datum falls in the requester's own domain, it will be a local request, otherwise it will be a remote request. If a home node needs a datum, currently held by a remote node, it will issue a forwarding request to the remote node. In terms of service, the cache coherence protocol provides a plurality of services, some by the remote node and some by home node.

In some embodiments, each table in the specification generated by the specification generation engine 102 under the cache-coherence protocols such as OCI contains one line for every combination of a valid state and input, providing what the next state should be, and what are the protocol commands to issue to each of the nodes (also referred to as the output). For the home table depicted by the example in FIG. 4A, each state in the line includes "Cmd," which represents the request being processed, the state of the node's cache directory (H for home), and the state of each of the other nodes in the protocol directory (N1, N2, N3). The Remote table depicted in the example in FIG. 4B has a similar current/next state, but only one directory state "St" which is the state of its cache directory. Here the output consists of a command (request or response) that is sent to the home node, and a column for the possible response that can be also sent to the other remote nodes.

In some embodiments, the specification generation engine 102 is configured to generate coverage points for all legal sequence/transactions in addition to coverage points for legal states and single-step transitions. The IC design protocol may contain stable as well as transient states, where a stable state does not have any outstanding command in process, and whereas a transient state has an outstanding command. The stable states' set represent possible starting and end states of transactions in the table. The transient states' represent the intermediate states of the transactions. A transaction typically includes a starting stable state and an ending stable state and with some possible transient states in the middle. A transaction may not have a transient state for example in the case of a cache hit for an address.

Algorithmically, the specification generation engine 102 is configured to capture all paths that lead from "Cmd" going "none" to "none" as shown in FIGS. 4A and 4B, i.e., from the request arriving (or becoming active) to its existing/retiring. Although finding all paths between two nodes in a directed graph without any loops is an NP-complete problem, the specification generation engine 102 adopts a protocol graph that is based upon independent command groups and can be divided into smaller graphs, thus significantly reducing the total time to construct these paths. FIG. 5A depicts an example of a table for a sample home transaction under OCI having a "Cmd" going from "none" to "none" with one intermediate transition. In the initial state, remote node N1 has an exclusive (E) state for a given address. A core at home requests to share this datum (OCI_LD). The protocol sends a forwarding request (FWDH) to the remote node N1. However at the same time, the remote node was in the process of evicting this address. Therefore the remote node replied with "I am invalid for this address" (REM_INV) message. Since OCI is an out-of-order protocol, REM_INV may reach home before victim data (VDATA) reaches home. Meanwhile, REM_INV will put N1's state in a transient state (S->I) in the home directory for this datum. These two messages may be received in opposite order, but that will be another transaction.

Although the total number of legal transactions generated from the IC design protocol can be in the thousands, it has been observed that most of the transactions share similar templates of sequences. As such, the specification generation engine 102 is configured to identify all the unique sequences from the transaction table and create a parameterized SVA sequence for each of these unique sequences. The parameterized SVA sequences were then instantiated for all the cases depicted in the original protocol tables. FIG. 5B depicts an example of one possible SVA sequence 500 capturing the OCI transaction shown in the table of FIG. 5A. Here, the general template observes four and tracks three states: 1) outstanding command for an address at OCI; 2) State of the address at the home node; and 3) State of the remote node recorded at home. It also watches the input and output channels for the given address. As shown in the example of FIG. 5B, The SVA sequence homeTrans_111 captures any protocol sequence resulting from a home core request while the datum is exclusive (E) at the remote node N1. The specification generation engine 102 is configured to identify two types of states in these sequences: waiting state and transition state. The waiting state models an arbitrary wait for something to happen, while the transition state represents a protocol table line transition that should happen in one clock cycle. The operator "[*1:$]" lets a coverage monitoring component (or coverage monitor) stay in a waiting state as long as the next state transition is not qualified. Once that transition happens, The coverage monitor expects a one cycle transition to the next waiting state. Finally, $cover_{13}$ homeTrans_OCI_LD creates an instance of a coverage monitor which, upon observing an OCI_LD request from a home core, starts following the sequence homt_trans_111.

In some embodiments, the coverage validation engine 104 generates coverage monitors for all possible transactions at the home node and remote nodes and runs them against the FV model. The total number of the coverage monitors can be very large for formal verification, but each coverage monitor is proved reachable individually. This observation provided sufficient parallelism for the coverage validation engine 104 to run majority of the coverage monitors with formal verification without state-space explosion to determine for all coverage monitors whether they are reachable or not.

In some embodiments, the coverage data collection engine 106 uses System Verilog coverage group constructs to capture coverage information such as coverage groups, coverage points, and cross-coverage to model coverage monitors for the reference model being used in the simulation environment as discussed above. Here, System Verilog provides constructs to model transitions as coverage bins. A state transition can be modeled as A=>B, where A and B can be a bunch of signals concatenated together. Furthermore, there are operators available for consecutive (A[*5]=>B) as well as non-consecutive (A[=5]=>B) transitions. These constructs and operators provide sufficient language support to clone SVA properties used in the formal model as coverage bins inside the cover groups defined in the reference model. FIG. 6 depicts an example of an implementation 600 of the coverage monitor for the home tables' protocol. The coverage monitor is defined as a System Verilog coverage group construct and is part of the class defining an address's protocol behavior in a verification environment. Request_type coverage points are used to group various core requests to the protocol. The transitions are modeled as the aggregation of signals representing protocol state. The actual transitions are auto generated (file "HOME_TRANS_COV.SV"). There are thousands of these transitions and a sample for the running example case is shown at the bottom of FIG. 4, where SDELAY is a system parameter that defines the arbitrary length of the time the coverage monitor may wait in a state and depends upon the implementation. Once created, coverage bin HomeTrans_O-CI_LD_1 will trigger for an address. If the remote node has exclusive state on this address and a core from home issued OCI_LD, it will watch for a forwarding message put forth for the remote node and then wait for response to appear. The behavior is essentially same as of the sequence in FIG. 5A and cover_homeTrans_OCI_LD_1 in FIG. 5B.

The SVA and System Verilog coverage group constructs discussed above describe the coverage models at abstract levels. Since the RTL implementation of the IC design protocol has many more details, it must be covered in depth as that is what matters most. As mentioned above, the specification generation engine 102 automatically generates a SV package from the tables of the specification and enhances the packages with annotations such that each table-transition has a unique identification label. During each RTL simulation, the coverage data collection engine 106 pushes the unique identification label into special instrumentation buffers for each executed transition (wherein these buffers are not synthesized). When a protocol cycle completes, the coverage data collection engine 106 records the sequence it corresponds to as having occurred. At the end of each simulation run, the coverage data collection engine 106 dumps these sequence counts into text-files. In some embodiments, the coverage data collection engine 106 runs a script on top of the text-files, looks at the transition labels and their sequences, compares that to the sequence table generated from the IC design protocol (and used in reference model and FV model coverage generation) and accumulates coverage data. The output of the script provides continuous updates on the covered sequences in runs. Additionally, sequences that are not possible solely because of stimulus restrictions are filtered so that the coverage data collection engine 106 can determine the true coverage of the simulation.

One embodiment may be implemented using a conventional general purpose or a specialized digital computer or microprocessor(s) programmed according to the teachings of the present disclosure, as will be apparent to those skilled in the computer art. Appropriate software coding can readily be prepared by skilled programmers based on the teachings of the present disclosure, as will be apparent to those skilled in the software art. The invention may also be implemented by the preparation of integrated circuits or by interconnecting an appropriate network of conventional component circuits, as will be readily apparent to those skilled in the art.

One embodiment includes a computer program product which is a machine readable medium (media) having instructions stored thereon/in which can be used to program one or more hosts to perform any of the features presented herein. The machine readable medium can include, but is not limited to, one or more types of disks including floppy disks, optical discs, DVD, CD-ROMs, micro drive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data. Stored on any one of the computer readable medium (media), the present invention includes software for controlling both the hardware of the general purpose/specialized computer or microprocessor, and for enabling the computer or microprocessor to interact with a human viewer or other mechanism utilizing the results of the present invention. Such software may include, but is not limited to, device drivers, operating systems, execution environments/containers, and applications.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Particularly, while the concept "component" is used in the embodiments of the systems and methods described above, it will be evident that such concept can be interchangeably used with equivalent concepts such as class, method, type, interface, module, object model, and other suitable concepts. Embodiments were chosen and described in order to best describe the principles of the invention and its practical application, thereby enabling others skilled in the relevant art to understand the claimed subject matter, the various embodiments and with various modifications that are suited to the particular use contemplated.

What is claimed is:

1. A system to support automatic functional coverage generation and management for an integrated circuit (IC) design protocol, comprising:
 a specification generation engine running on a host, which in operation, is configured to automatically generate one or more specifications for functional coverage of the IC design protocol based on inputs from an architect of the IC design protocol;
 a coverage validation engine running on a host, which in operation, is configured to validate the one or more specifications for the functional coverage and generate coverage data on reachable states at formal verification (FV) level;
 a coverage data collection engine running on a host, which in operation, is configured to conduct simulation of the IC design protocol and collect coverage data of reached coverage points at register-transfer level (RTL); and a coverage data analysis engine running on a host, which in operation, is configured to analyze and verify completeness of the functional coverage of the IC design protocol based on the coverage data collected at the formal verification level and at the RTL, respectively;

wherein the IC design protocol is a directory-based cache coherence protocol, which connects a plurality of System-on-Chips (SOCs) as a single multicore processor via connections among the SOCs.

2. The system of claim 1, wherein:

each of the one or more specifications includes one or more state tables that include information related to the implementation of the IC design protocol to be shared among various phases of an IC design process.

3. The system of claim 2, wherein:

each of the state tables is in parsable ASCII format without having any hidden states, assumptions, redundancy, or dead-ends.

4. The system of claim 1, wherein:

the specification generation engine is configured to automatically generate a FV model for formal verification of the IC design protocol, wherein the FV model includes a formally verifiable set of files generated as a composition of one or more roles/services tables, templates, and instrumentations of the chips in the IC design protocol.

5. The system of claim 1, wherein:

the specification generation engine is configured to automatically specify coverage properties of the IC design protocol in System Verilog Assertions (SVA) specification, which describes properties of the IC design protocol in a declarative way with an ability to be implemented both in formal verification as well as simulation.

6. The system of claim 1, wherein:

the specification generation engine is configured to automatically generate collection points for legally defined and illegal sequences in the IC design protocol, wherein the automatically generated coverage points model and cover one or more of state coverage, transitions coverage, transaction coverage, sequence coverage and cross-coverage for the IC design protocol.

7. The system of claim 1, wherein:

the specification generation engine is configured to automatically generate an annotated synthesizable package, which is annotated with coverage properties from the one or more specifications for RTL implementation of the IC design protocol.

8. The system of claim 1, wherein:

the coverage data analysis engine is configured to compare the coverage data collected at the formal verification level and the RTL simulation and provide guidance to revise the simulation at the RTL.

9. The system of claim 1, wherein:

the coverage data analysis engine is configured to compare the coverage data collected at the formal verification level and the RTL simulation and provide feedback to revise the FV model for formal verification.

10. The system of claim 1, wherein:

the coverage data analysis engine is configured to compare the coverage data collected at the formal verification level and the RTL simulation and provide feedback to revise the one or more specifications for the functional coverage of the IC design protocol.

11. A computer-implemented method to support automatic functional coverage generation and management for an integrated circuit (IC) design protocol, comprising:

automatically generating one or more specifications for functional coverage of the IC design protocol based on inputs from an architect of the IC design protocol;

validating the one or more specifications for the functional coverage and generating coverage data on reachable states at formal verification (FV) level;

conducting simulation of the IC design protocol and collecting coverage data of reached coverage points at register-transfer level (RTL);

analyzing and verifying completeness of the functional coverage of the IC design protocol based on the coverage data collected at the formal verification level and at the RTL, respectively; and wherein the IC design protocol is a directory-based cache coherence protocol, which connects a plurality of System-on-Chips (SOCs) as a single multicore processor via connections among the SOCs.

12. The computer-implemented method of claim 11, further comprising:

including one or more state tables in each of the one or more specifications, wherein each of the tables includes information related to the implementation of the IC design protocol to be shared among various phases of an IC design process.

13. The computer-implemented method of claim 11, further comprising:

automatically generating a FV model for formal verification of the IC design protocol, wherein the FV model includes a formally verifiable set of files generated as a composition of one or more roles/services tables, templates, and instrumentations of the chips in the IC design protocol.

14. The computer-implemented method of claim 11, further comprising:

automatically specifying coverage properties of the IC design protocol in System Verilog Assertions (SVA) specification, which describes properties of the IC design protocol in a declarative way with an ability to be implemented both in formal verification as well as simulation.

15. The computer-implemented method of claim 11, further comprising:

automatically generating collection points for legally defined and illegal sequences in the IC design protocol, wherein the automatically generated coverage points model and cover one or more of state coverage, transitions coverage, transaction coverage, sequence coverage and cross-coverage for the IC design protocol.

16. The computer-implemented method of claim 11, further comprising:

automatically generating an annotated synthesizable package, which is annotated with coverage properties from the one or more specifications for RTL implementation of the IC design protocol.

17. The computer-implemented method of claim 11, further comprising:

comparing the coverage data collected at the formal verification level and the RTL simulation and providing guidance to revise simulation at the RTL.

18. The computer-implemented method of claim 11, further comprising:

comparing the coverage data collected at the formal verification level and the RTL simulation and provide feedback to revise the FV model for formal verification.

19. The computer-implemented method of claim 11, further comprising:

comparing the coverage data collected at the formal verification level and the RTL simulation and provide feedback to revise the one or more specifications for the functional coverage of the IC design protocol.

* * * * *